United States Patent [19]
Wu

[11] Patent Number: 5,899,715
[45] Date of Patent: May 4, 1999

[54] METHOD TO FORM A CAPACITOR FOR HIGH DENSITY DRAM CELL

[75] Inventor: Shye-Lin Wu, Hsinchu, Taiwan

[73] Assignee: Texas Instruments—Acer Incorporated, Hsinchu, Taiwan

[21] Appl. No.: 09/023,453

[22] Filed: Feb. 13, 1998

[51] Int. Cl.[6] .................................................. H01L 21/8242
[52] U.S. Cl. ............................................. 438/253; 438/254
[58] Field of Search .................................... 438/253–256, 438/390–396; 257/308

[56] References Cited

U.S. PATENT DOCUMENTS 5,180,689  1/1993  Liu et al. .
5,384,276  1/1995  Ogawa et al. .

Primary Examiner—Jey Tsai
Attorney, Agent, or Firm—Harness, Dickey & Pierce, P.L.C.

[57] ABSTRACT

A new method for the manufacturing of a capacitor for a DRAM is disclosed herein. The method for manufacturing a capacitor on a semiconductor wafer including the following steps. Firstly, sequentially forming a first dielectric layer, a first conductive layer, a second dielectric layer and a third dielectric layer formed on the semiconductor wafer. Secondary, the third dielectric layer and a portion of the second dielectric layer are etched. The portion of the second dielectric layer is isotropically etched to form a hemispherical cavity. Next, the second dielectric layer, the first conductive layer and the first dielectric layer is etched sequentially to form a hole in contact with a portion of the semiconductor wafer by using the third dielectric layer as a mask. Subsequently, the third dielectric layer is removed when etching the first dielectric layer. Afterword, a second conductive layer is formed on the second dielectric layer and in the hole. Next, a pattern for an underlying electrode is formed by anisotropically etching a portion of the second conductive layer, the second dielectric layer and the first conductive layer. Successively, the first dielectric layer is isotropically etched, and a fourth dielectric layer is formed on the underlying electrode. Finally, a third conductive layer is formed on the fourth dielectric layer to form an upperlying electrode of the capacitor.

18 Claims, 4 Drawing Sheets

METHOD TO FORM A CAPACITOR FOR HIGH DENSITY DRAM CELL

FIELD OF THE INVENTION

The present invention relates to the fabricating of a semiconductor capacitor in a DRAM cell, and particularly relates to a method of fabricating a capacitor with a large capacitance.

BACKGROUND OF THE INVENTION

Semiconductor Dynamic Random Access Memory (DRAM) devices have been applied in the integrated circuits for many years. A DRAM cell is in general a semiconductor memory device with one transistor and one capacitor, in which data of 1-bit can be stored by the charge stored therein. Indeed, a memory cell is provided for each bit stored by a DRAM device. Each memory cell typically consists of a storage capacitor and an access transistor. The source of the access transistor is connected to one terminal of the capacitor. The transistor drain electrode and the gate electrode are connected to external connection lines called a bit line and a word line, respectively. The other terminal of the capacitor is connected to a reference voltage. Therefore, the formation of a DRAM memory cell comprises the formation of a transistor, a capacitor and contacts to the external circuits.

As a tendency to the higher density of an integrated semiconductor device, it causes the density of the DRAM cells to be increased, and the area occupied by one memory cell becomes gradually decreased. Due to the trend of making the semiconductor devices, the sizes of the memory cells have gotten smaller and smaller. Thus, the area available for a single memory cell has become very small. This has caused a reduction in the area occupied by the capacitor, and has resulted in a reduction of the capacitance of a cell. For the very small memory cells, planar capacitor has become very difficult for use reliably. Specifically, as the size of the capacitor is decreased, the capacitance of the capacitor is also decreased and the amount of the charge capable of being stored by the capacitor is similarly decreased. Therefore, the present invention is devoted to the manufacture of a capacitor with a maximum capacity in a limited area.

Prior art with the approach to overcome these problems, has resulted in the development of the various types of capacitors. One of the capacitors has the bathtub-shaped structure. The process is operated with the characteristic that the staked capacitor has more capacitance than that of the planar type capacitor. In order to increase the capacitance of the capacitor, the thickness of the dielectric film of the capacitor is reduced, and the area of the electrodes of the capacitor is increased by overcoming the limitation of the lithography technique. In other words, the area of the electrodes in one memory cell is increased without the problem of step coverage. Please see "Method For Fabricating Staked Capacitors In A DRAM Cell, Jin-Suk Choi. et al., U.S. Pat. No. 5,104,281". Yet, the shape of the storage node of the memory cell is like a bathtub, and the height of the electrode is not extended, so that the area of the electrodes is not largely increased.

Further, a capacitor over bit line (COB) cell with a hemispherical grain silicon storage node has been developed (see "Capacitor Over Bit Line Cell With Hemispherical Grain Storage Node For 64 Mb DRAMs", M. Sakao et al., microelectronics research laboratories, NEC Corporation, IEDM Tech Dig., Dec. 1990, pp655–658). The HSG-silicon is deposited by low pressure chemical vapor deposition method at the transition temperature from amorphous silicon to polycrystalline silicon. This memory cell provides high capacitance by increasing the effective surface area of a simple storage node. The present invention increases the effective area of the electrodes of the capacitor without the usage of the HSG-silicon; thus the process is simplified.

SUMMARY OF THE INVENTION

The foregoing disadvantages of the traditional method to fabricate a capacitor for a DRAM can be overcome by a new method that is disclosed herein. The method for manufacturing a capacitor on a semiconductor wafer including the following steps. Firstly, a first dielectric layer, a first conductive layer, a second dielectric layer and a third dielectric layer is sequentially formed on the semiconductor wafer. Secondary, the third dielectric layer and a portion of the second dielectric layer are etched. The portion of the second dielectric layer is isotropically etched by the using of the HF solution to form a hemispherical cavity. Next, the second dielectric layer, the first conductive layer and the first dielectric layer are etched sequentially to form a hole in contact with a portion of the semiconductor wafer by using the third dielectric layer as a mask. Subsequently, the third dielectric layer is removed when etching the first dielectric layer.

Afterword, a second conductive layer is formed on the second dielectric layer and in the hole. Next, a pattern for an underlying electrode is formed by anisotropically etching a portion of the second conductive layer, the second dielectric layer and the first conductive layer. Successively, the first dielectric layer is isotropically etched, and a fourth dielectric layer is formed on the underlying electrode. Finally, a third conductive layer is formed on the fourth dielectric layer to form an upperlying electrode of the capacitor.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method for forming a capacitor used in a DRAM cell is disclosed herein. To increase the effective area of the electrodes of the capacitor, the present invention provides a method for fabricating a capacitor of high capacitor without delicate or complex process. The memory cell includes a transfer transistor and a capacitor, and is provided for each bit stored by a DRAM device. Either the source or drain of the transfer transistor is connected to one terminal of the capacitor. The other side of the transistor and the transistor gate electrode are connected to the external connection lines called a bit line and a word line respectively. The other terminal of the capacitor is connected to a reference voltage.

Figure 1:
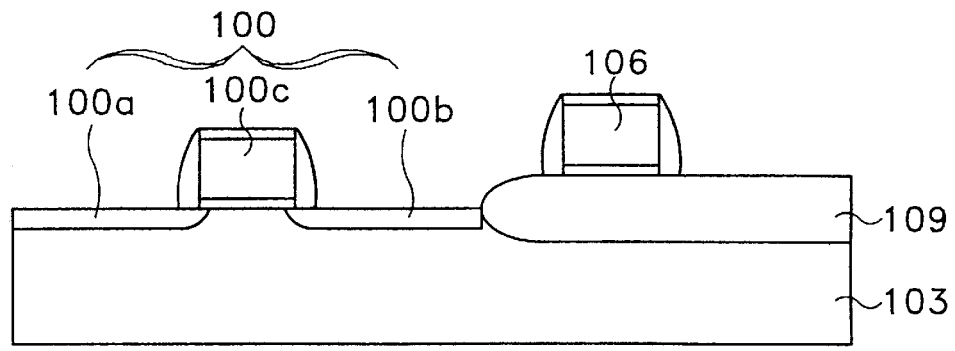
FIG. 1 is a cross sectional view of a semiconductor wafer illustrating the transfer transistor and a word line on the field oxide, the transfer transistor includes drain electrode, gate electrode and the source electrode.
Figure 2:
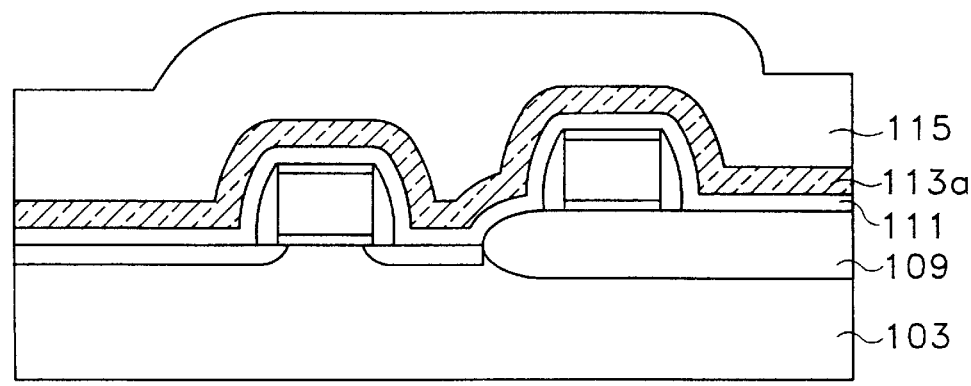
FIG. 2 is a cross sectional view of a semiconductor wafer illustrating the steps of sequentially forming a silicon nitride layer, a doped poly-silicon layer and a borophosphosilicate glass (BPSG) layer on the first poly-silicon layer.

The cross sectional view of the wafer with a transfer transistor and a word line on the substrate is shown in FIG. 1. The drain electrode 100a and the source electrode 100b, which is formed in the substrate 103, combined with the gate electrode 100c becomes the transfer transistor 100. The word line 106 is formed on the field oxide 109. Turning next to FIG. FIG. 2, a first dielectric layer 111 is formed on the topography of the wafer. The next step is to form a first conductive layer 113a on the first dielectric layer 111 followed by forming a second dielectric layer 115 on the first conductive layer. The first dielectric layer 111 is formed of a suitable materiel preventing etching through the first dielectric layer 111 when etching the first conductive layer 113a. The first dielectric layer 111 can be preferably formed of silicon nitride ($Si_3N_4$), and the first conductive layer 113a is preferably formed of Chemical Vapor Deposition (CVD) doped poly-silicon. The second dielectric layer 115 is preferably formed of borophosphosilicate glass (BPSG) or TEOS-oxide. The thickness of the second dielectric layer is preferably about 500–2000 angstroms.

Figure 3:
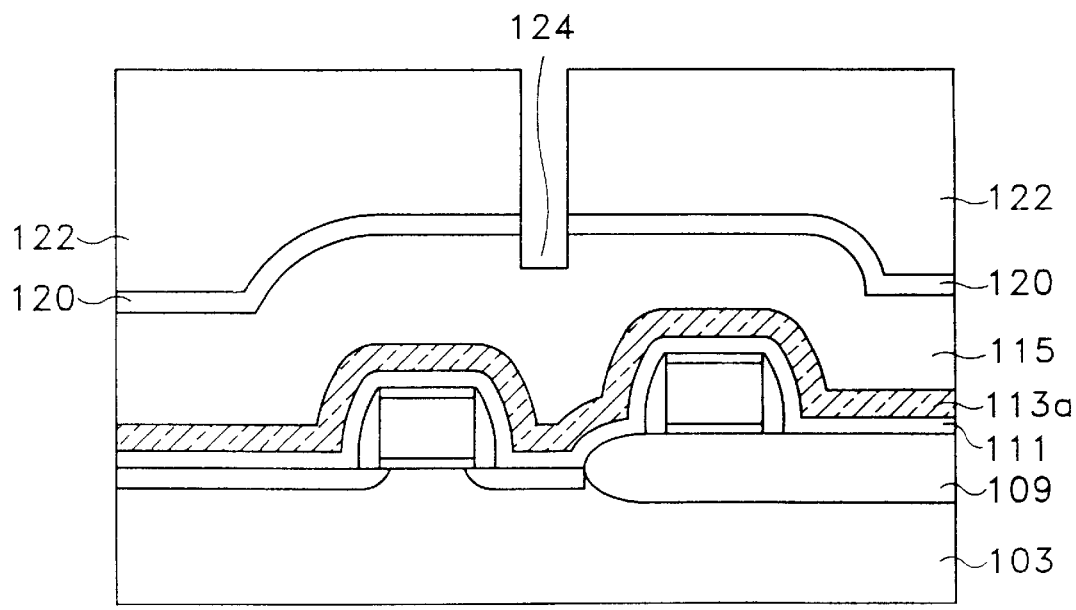
FIG. 3 is a cross sectional view of a semiconductor wafer illustrating the steps of forming an undoped poly-silicon layer, and then etching the undoped poly-silicon layer and a portion of the BPSG layer.
Figure 4:
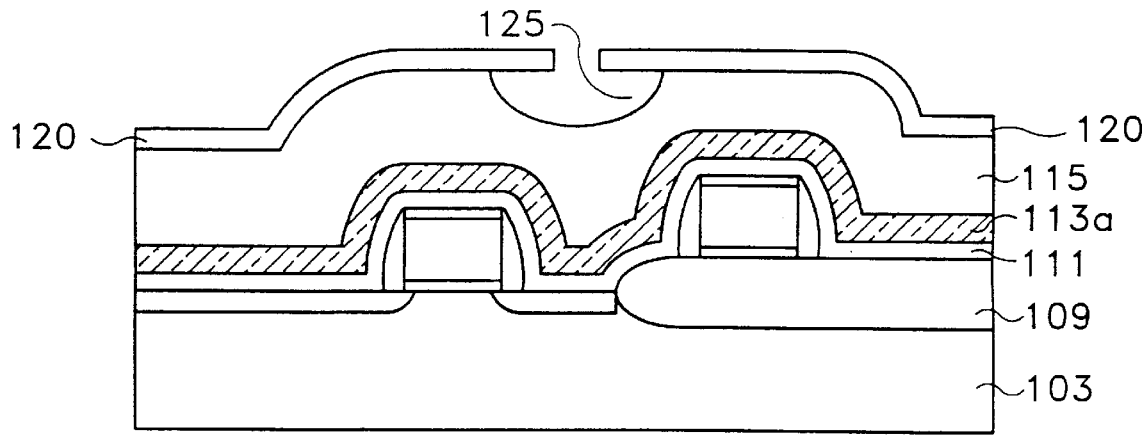
FIG. 4 is a cross sectional view of a semiconductor wafer illustrating the steps of isotropically etching the etched portion of the BPSG layer.

Turing to FIG. 3, a third dielectric layer 120 is formed on the second dielectric layer 115, and then a photoresist layer 122 is spinned on the third dielectric layer 120. The third dielectric layer is formed of a suitable material that can act as a hard mask in the following etching steps. The preferable material that forms the third dielectric layer 120 in this preferred embodiment is undoped poly-silicon. Being processed by lithography and etching steps, a first hole 124 is formed in the photoresist layer 122, third dielectric layer 120 and a portion of the second dielectric layer 115. The thickness of the third dielectric layer is preferably about 300–3000 angstroms. The next step is shown in FIG. 4, an isotropic etching is performed that the second dielectric layer is further etched. A hemispherical cavity 125 is thus formed in the second dielectric layer, and the third dielectric layer is not etched in this etching process. The etching process is preferably a wet etching process that uses the diluted HF or BOE solution as an etchant.

Figure 5:
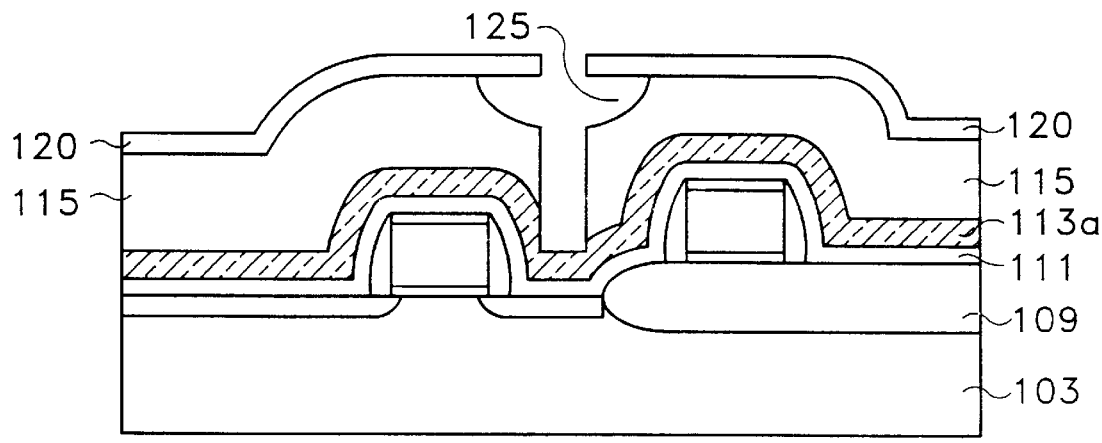
FIG. 5 is a cross sectional view of a semiconductor wafer illustrating the step of etching the BPSG layer using the etched undoped poly-silicon as a mask, the etching stop at the surface of the doped poly-silicon.
Figure 6:
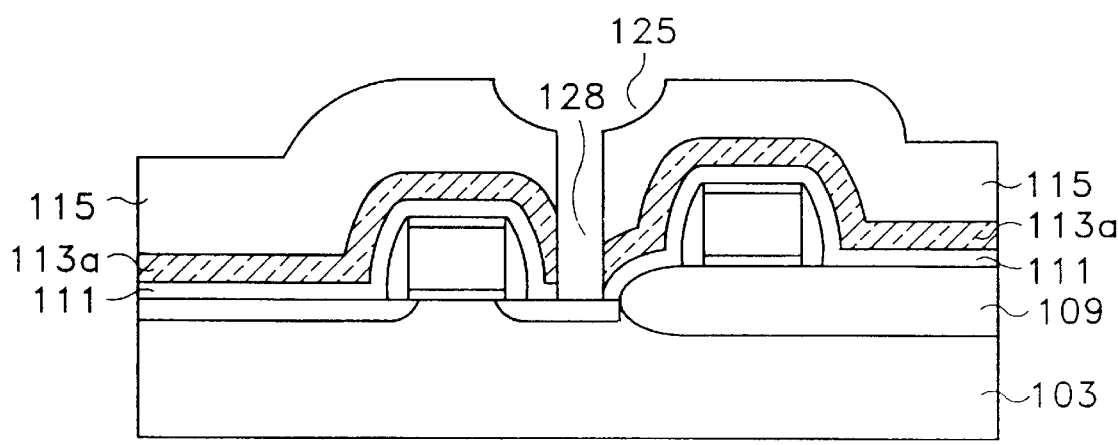
FIG. 6 is a cross sectional view of a semiconductor wafer illustrating the step of etching the doped poly-silicon layer and the undoped poly-silicon at a time, followed by a step of etching the silicon nitride layer.

Referring next to FIG. 5, an anisotropic etching is used to etch through the second dielectric layer 115 and stop at the first conductive layer 113a. The etchant has the etching selectivity between oxide and poly-silicon about 100 to 1, and the etchant is preferably an anisotropic etching by using $CHF_3$, $C_2F_6$, or $C_3F_8$ as an etchant. Next, turning to FIG. 6, the first conductive layer 113a is removed together with the third dielectric layer 120 in a dry etching. The dry etching uses an etchant such as $CClF_3+Cl_2$, $CHCl_3+Cl_2$ or $SF_6$. After the aforementioned process, the next step is to etch the first dielectric layer 111 to form a second hole 128 at the bottom of the hemispherical cavity 125, and stretch to the surface of the source electrode 100b in the substrate 103. The first conductive layer 113a is used to perform the self-aligned contact.

Figure 7:
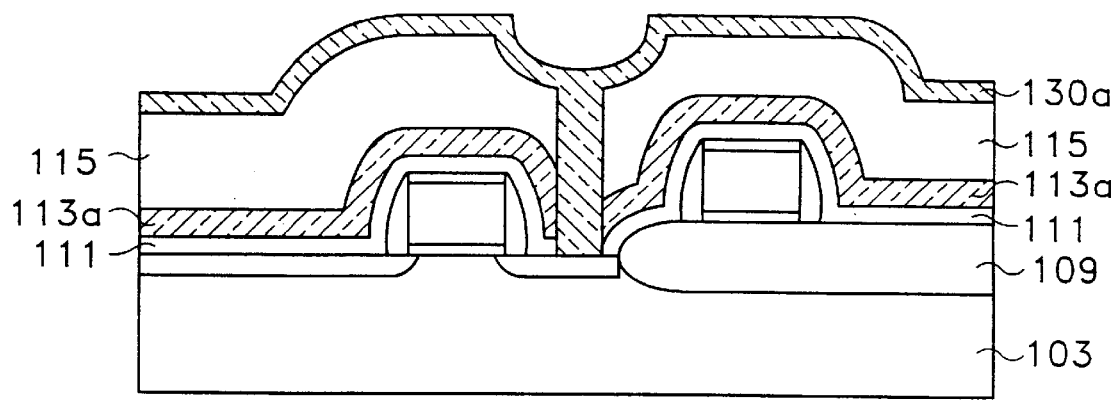
FIG. 7 is a cross sectional view of a semiconductor wafer illustrating the step of forming a doped poly-silicon layer.
Figure 8:
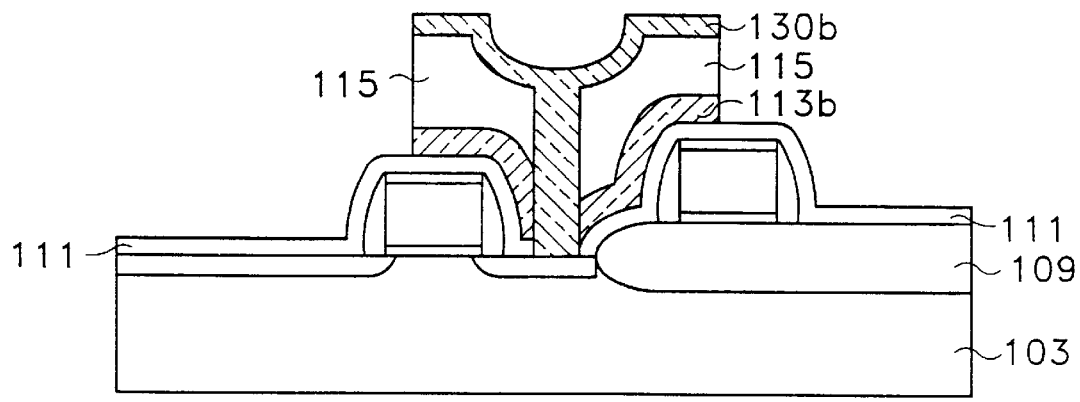
FIG. 8 is a cross sectional view of a semiconductor wafer illustrating the step of defining the storage node of the capacitor.
Figure 9:
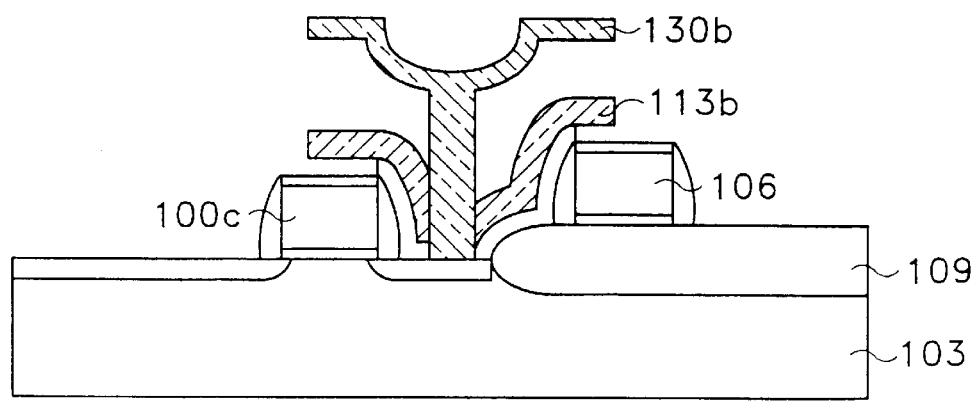
FIG. 9 is a cross sectional view of a semiconductor wafer illustrating the step of removing the residual BPSG in the storage node and then etching the exposed silicon nitride layer, so that the underlying electrode of the capacitor is formed thereby.

Next, a second conductive layer 130a is formed in the second hole 128 and on the surface of the second dielectric layer 115 as well as the hemispherical cavity 125. Referring to FIG. 7, the second conductive layer 130a is preferably formed of doped poly-silicon in this preferred embodiment. The doped poly-silicon is doped with conductive impurity. To define the storage node of the capacitor of the memory cell, the lithography and etching is utilized, and the bottom electrode of the capacitor is formed. The etching process defining the storage node stops at the surface of the first dielectric layer 111. As shown in FIG. 8, the storage node is defined and the truncated first conductive layer 113b together with the truncated second conductive layer 130b form the bottom electrode of the capacitor. The portions of the first dielectric layer that is not covered by the truncated first conductive layer 113b, then the portion of the second dielectric layer 115 between the truncated first conductive layer 113b and the truncated second conductive layer 130b are removed in the next step. The result is shown in FIG. 9, in which the first dielectric layer is removed. The gap between the truncated first dielectric layer 113b and the gate electrode 100c as well as the word line 106 can increase the effective area of the electrode of the capacitor. The etchant used to remove the first dielectric layer in this preferred embodiment is $CF_4/O_2$, $CF_4/H_2$ or $CHF_3$.

Figure 10:
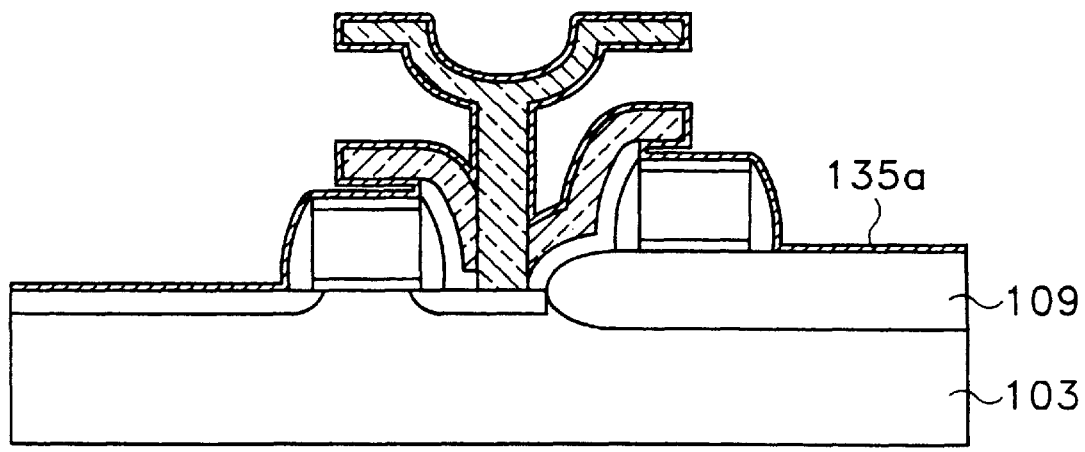
FIG. 10 is a cross sectional view of a semiconductor wafer illustrating the step of forming a fourth dielectric layer, thus the dielectric film of the capacitor is formed thereby.
Figure 11:
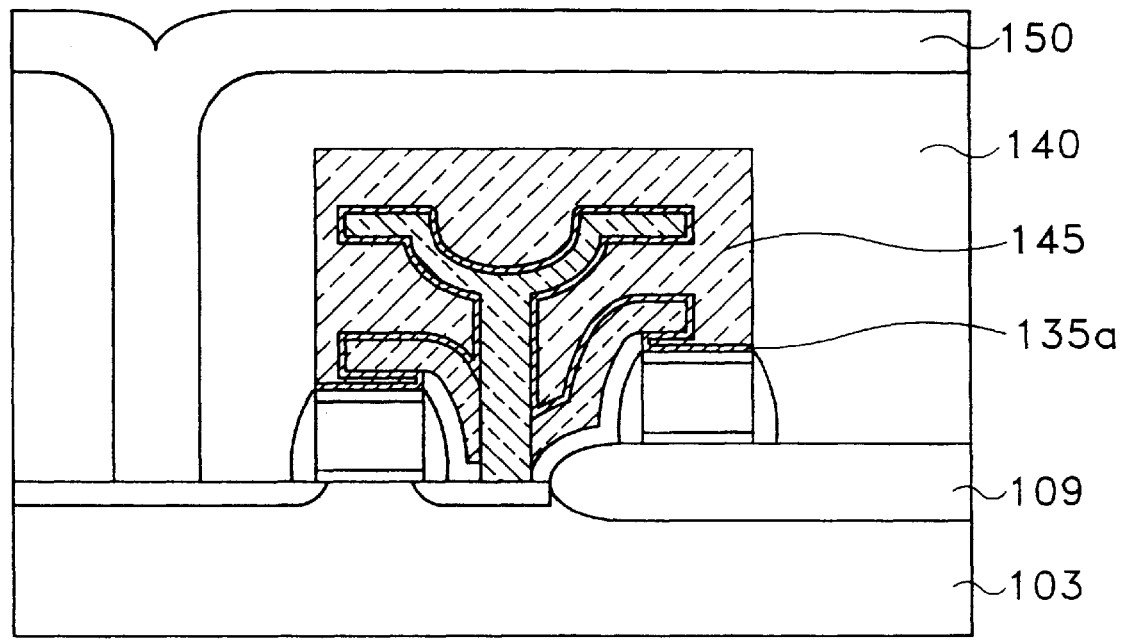
FIG. 11 is a cross sectional view of a semiconductor wafer illustrating the steps of forming a doped poly-silicon layer, and then defining the cell plate and a step of forming the bit line.

The next step is to form the dielectric layer on the surface of the bottom electrode of the capacitor. Referring to FIG. 10, the fourth dielectric layer 135 is formed on the topography of the wafer. The fourth dielectric layer 135a is preferably formed of ONO, $Ta_2O_5$, PZT and BST. Having been processed by lithography, etching, and then the deposition of the third conductive layer, the cell plate is thus formed. Referring next to FIG. 11, the fourth dielectric layer 135a is truncated to fit the size of the cell plate and the truncated fourth dielectric layer 135b is the dielectric film of the capacitor. Forming a third conductive layer 140 on the surface of the truncated fourth dielectric layer 135b, the top electrode of the capacitor is thus formed. Thus, the cell plate is thus formed now. Followed by the deposition of the fifth dielectric layer 145 on the topography of the wafer and the formation of the bit line 150, the memory cell is thus formed.

As will be understood by persons skilled in the art, the foregoing preferred embodiment of the present invention is illustrative of the present invention rather than limiting the present invention. Having described the invention in connection with a preferred embodiment, for example, if the various etchant is used in the preferred embodiment, as long as the structure of the capacitor is the same as that disclosed herein, the modification will now suggest itself to those skilled in the art. While the preferred embodiment of the invention has been illustrated and described, it will be appreciated that various changes can be made therein without departing from the spirit and scope of the invention.

What is claimed is:

1. A method for manufacturing a capacitor on a semiconductor wafer, said method comprising the steps of:

forming a first dielectric layer on said semiconductor wafer;

forming a first conductive layer on said first dielectric layer;

forming a second dielectric layer on said first conductive layer;

forming a third dielectric layer on said second dielectric layer;

etching said third dielectric layer and a portion of said second dielectric layer;

etching said second dielectric layer, said first conductive layer and said first dielectric layer sequentially to form a hole in contact with a portion of said semiconductor wafer by using said third dielectric layer as a mask, said third dielectric layer is removed when etching said first dielectric layer;

forming a second conductive layer on said second dielectric layer and in said hole, said second conductive layer being in contact with said portion of said semiconductor wafer;

forming a pattern for an underlying electrode by anisotropically etching a portion of said second conductive layer, said second dielectric layer and said first conductive layer, followed by isotropically etching said first dielectric layer;

forming a fourth dielectric layer on said underlying electrode; and forming a third conductive layer on said fourth dielectric layer to form an upperlying electrode of said capacitor.

2. The method of claim 1, wherein said first dielectric layer is silicon nitride.

3. The method of claim 1, wherein said first conductive layer, said second conductive layer and said third conductive layer are doped poly-silicon that doped with conductive impurities.

4. The method of claim 1, wherein said second dielectric layer is selected from the group consisting of borophosphosilicate glass (BPSG) and TEOS-oxide.

5. The method of claim 1, wherein said third dielectric layer is poly-silicon.

6. The method of claim 1, wherein said portion of said second dielectric layer is formed by an isotropic etching.

7. The method of claim 1, wherein said pattern comprising said second conductive layer that in contact with said semiconductor wafer.

8. The method of claim 1, wherein said fourth dielectric layer is selected from the group consisting of ONO, $Ta_2O_5$, PZT and BST.

9. The method of claim 1, wherein said portion of said second dielectric layer is isotropically etched to form a hemispherical cavity by an etchant chosen from a group consisting of: HF solution and BOE solution.

10. The method of claim 1, wherein said hole is formed comprises etching said second dielectric layer from said hemispherical cavity to said first conductive layer using an etchant, said etchant having the etching selectivity between oxide and poly-silicon about 100 to 1.

11. A method for manufacturing a capacitor on a semiconductor wafer, said method comprising the steps of:

forming a first dielectric layer on said semiconductor wafer;

forming a first conductive layer on said first dielectric layer;

forming a second dielectric layer on said first conductive layer;

forming a third dielectric layer on said second dielectric layer;

etching said third dielectric layer and a portion of said second dielectric layer, said portion of said second dielectric layer is isotropically etched to form a hemispherical cavity by using the HF;

etching said second dielectric layer, said first conductive layer and said first dielectric layer sequentially to form a hole in contact with a portion of said semiconductor wafer by using said third dielectric layer as a mask, said third dielectric layer is removed when etching said first dielectric layer;

forming a second conductive layer on said second dielectric layer and in said hole, said second conductive layer being in contact with said portion of said semiconductor wafer;

forming a pattern for an underlying electrode by anisotropically etching a portion of said second conductive layer, said second dielectric layer and said first conductive layer, followed by isotropically etching said first dielectric layer;

forming a fourth dielectric layer on said underlying electrode; and forming a third conductive layer on said fourth dielectric layer to form an upperlying electrode of said capacitor.

12. The method of claim 11, wherein said first dielectric layer is silicon nitride.

13. The method of claim 11, wherein said first conductive layer, said second conductive layer and said third conductive layer are doped poly-silicon that doped with conductive impurities.

14. The method of claim 11, wherein said second dielectric layer is selected from the group consisting of borophosphosilicate glass (BPSG) and TEOS-oxide.

15. The method of claim 11, wherein said third dielectric layer is poly-silicon.

16. The method of claim 11, wherein said pattern comprising said second conductive layer that in contact with said semiconductor wafer.

17. The method of claim 11, wherein said fourth dielectric layer is selected from the group consisting of ONO, $Ta_2O_5$, PZT and BST.

18. The method of claim 11, wherein said hole is formed comprises etching said second dielectric layer from said hemispherical cavity to said first conductive layer using an etchant, said etchant having the etching selectivity between oxide and poly-silicon about 100 to 1.

* * * * *